(12) United States Patent
Quarantelli et al.

(10) Patent No.: US 12,416,663 B1
(45) Date of Patent: Sep. 16, 2025

(54) EMBEDDED SYSTEM TO CHARACTERIZE BTI DEGRADATION EFFECTS IN MOSFETs

(71) Applicants: Michele Quarantelli, Brescia (IT); Alberto Piadena, Guidizzolo (IT); Tomasz Brozek, Morgan Hill, CA (US); Christopher Hess, Belmont, CA (US); Larg Weiland, Hollister, CA (US); Sharad Saxena, Richardson, TX (US)

(72) Inventors: Michele Quarantelli, Brescia (IT); Alberto Piadena, Guidizzolo (IT); Tomasz Brozek, Morgan Hill, CA (US); Christopher Hess, Belmont, CA (US); Larg Weiland, Hollister, CA (US); Sharad Saxena, Richardson, TX (US)

(73) Assignee: PDF Solutions, Inc., Santa Clara, CA (US)

( * ) Notice: Subject to any disclaimer, the term of this patent is extended or adjusted under 35 U.S.C. 154(b) by 155 days.

(21) Appl. No.: 18/385,896

(22) Filed: Oct. 31, 2023

Related U.S. Application Data

(60) Provisional application No. 63/421,161, filed on Oct. 31, 2022.

(51) Int. Cl.
*G01R 31/26* (2020.01)
*G01R 19/00* (2006.01)
(Continued)

(52) U.S. Cl.
CPC ....... *G01R 31/2621* (2013.01); *G01R 31/275* (2013.01)

(58) Field of Classification Search
CPC ........ G01R 31/02; G01R 31/26; G01R 31/27; G01R 31/28; G01R 31/2621;
(Continued)

(56) References Cited

U.S. PATENT DOCUMENTS

2015/0369855 A1* 12/2015 Kawa ................. G01R 31/2628
716/136

FOREIGN PATENT DOCUMENTS

JP 2016111563 * 6/2016 ............. H03K 3/354

* cited by examiner

*Primary Examiner* — Neel D Shah
(74) *Attorney, Agent, or Firm* — David Garrod, Esq

(57) ABSTRACT

A novel system for in-product Bias Temperature Instability (BTI) characterization that allows for characterization of transistor degradation rates is disclosed; it is self-testing and can be embedded in real products without impacting the host functionality. The test data collected during product chip testing (at Electrical Wafer Sort) can be used for identification of abnormal material and for material disposition, or to predict the chip aging rate and premature failure risk due to BTI degradation. The system can also collect the data from the real time device aging in the field, during the host chip operational lifetime. The system is equipped with local programmable power supply generation and self-test capabilities to allow concurrent operations with the host application. The Devices Under Test (DUTs) consist of standard cell-based Ring Oscillators (ROs) which have the unique capability of decoupling the BTI effects on N-type and P-type MOSFET transistors. New switching circuitry is implemented that provides for minimal delay between the stress and measurement phases, thus giving the system the capability of fully characterizing the BTI relaxation dynamic.

11 Claims, 8 Drawing Sheets

Slave BTI sensor architecture (hard macro)

(51) Int. Cl.
 *G01R 31/27* (2006.01)
 *G01R 31/28* (2006.01)
 *G01R 31/52* (2020.01)
 *H03K 3/03* (2006.01)
 *H03K 3/354* (2006.01)

(58) Field of Classification Search
 CPC ...... G01R 31/275; G01R 31/52; G01R 19/00; H03K 3/03; H03K 3/354
 See application file for complete search history.

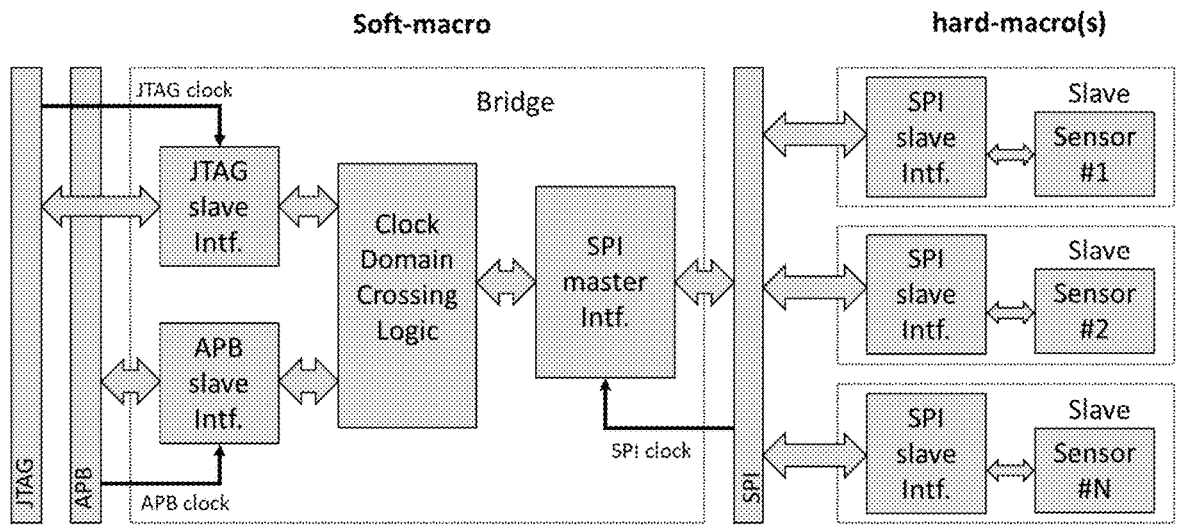
FIG. 1 Embedded sensor architecture
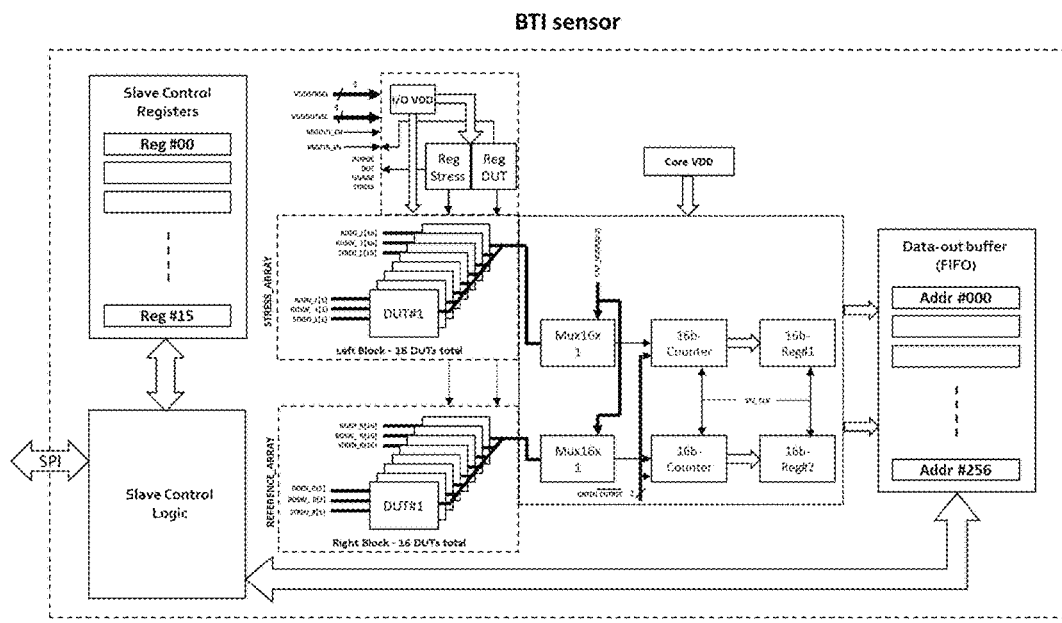
FIG. 2 Slave BTI sensor architecture (hard macro)

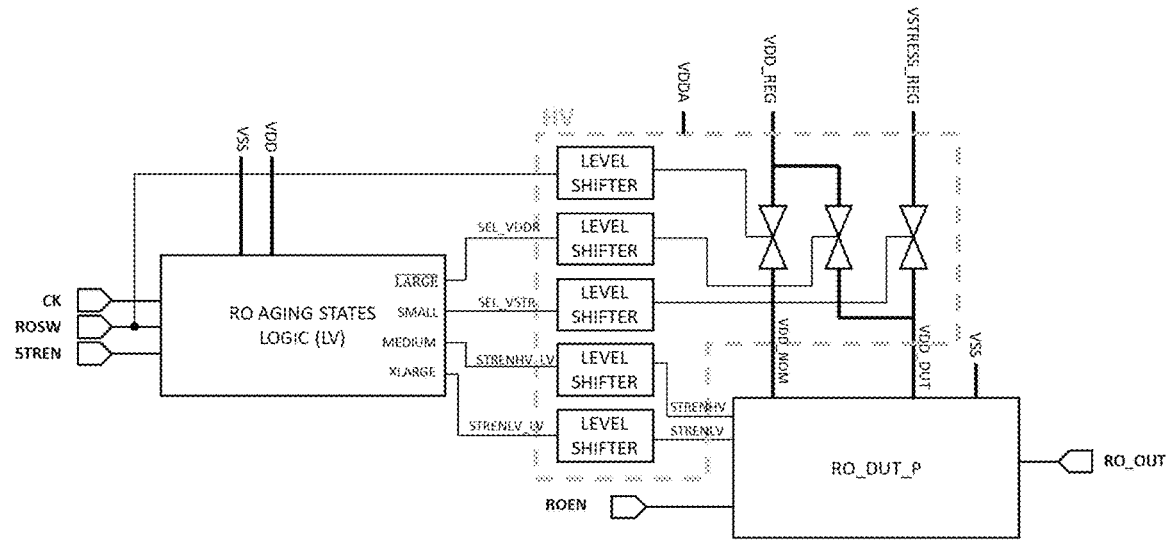
FIG. 3 P-type local control logic
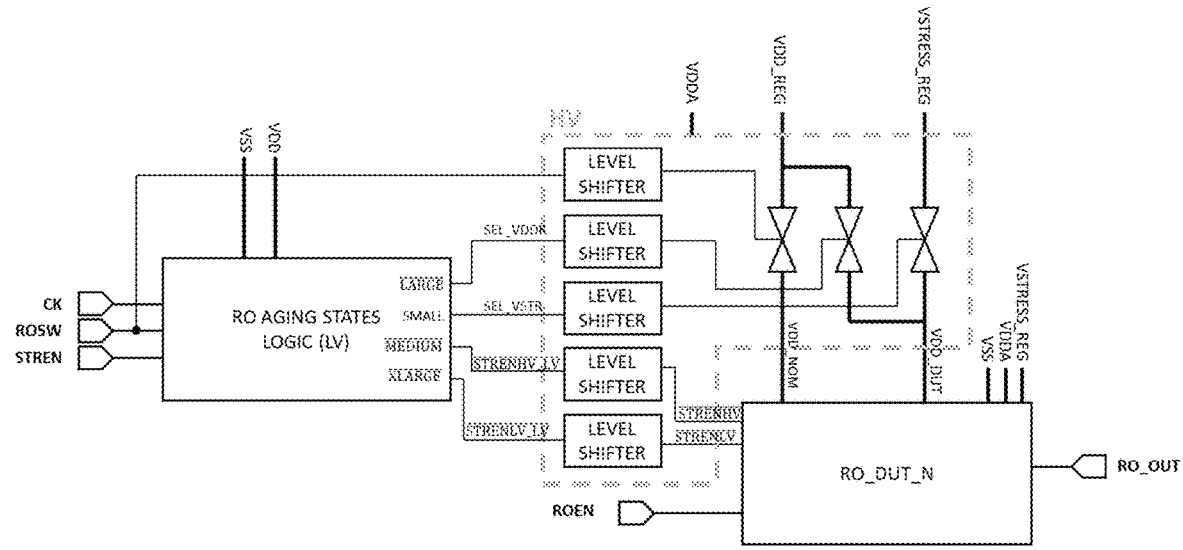
FIG. 4 N-type local control logic

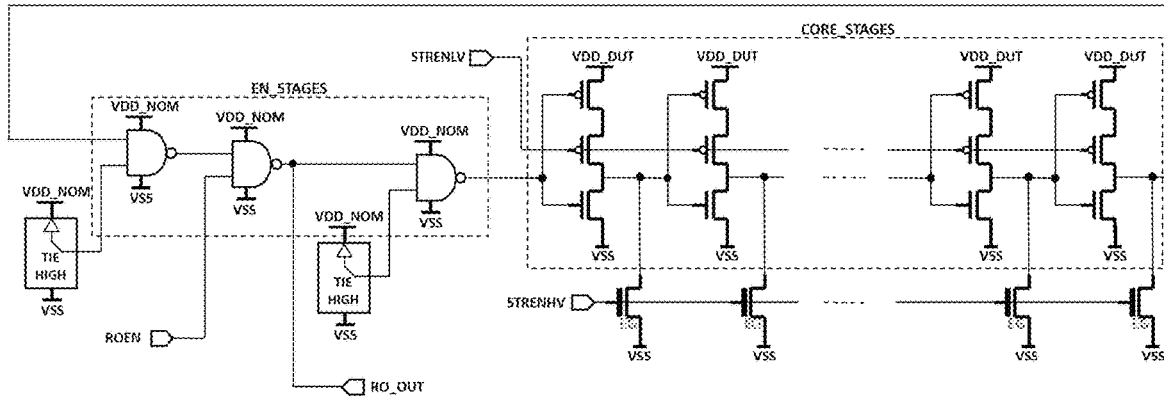
FIG. 5 RO_DUT_P
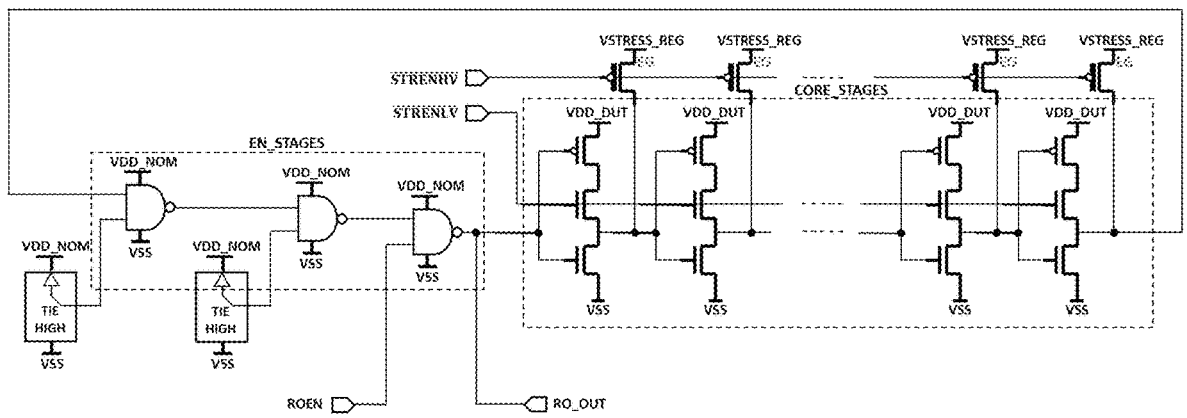
FIG. 6 RO_DUT_N
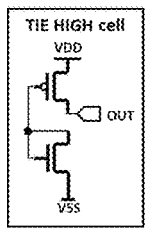
FIG. 7 TIE HIGH cell

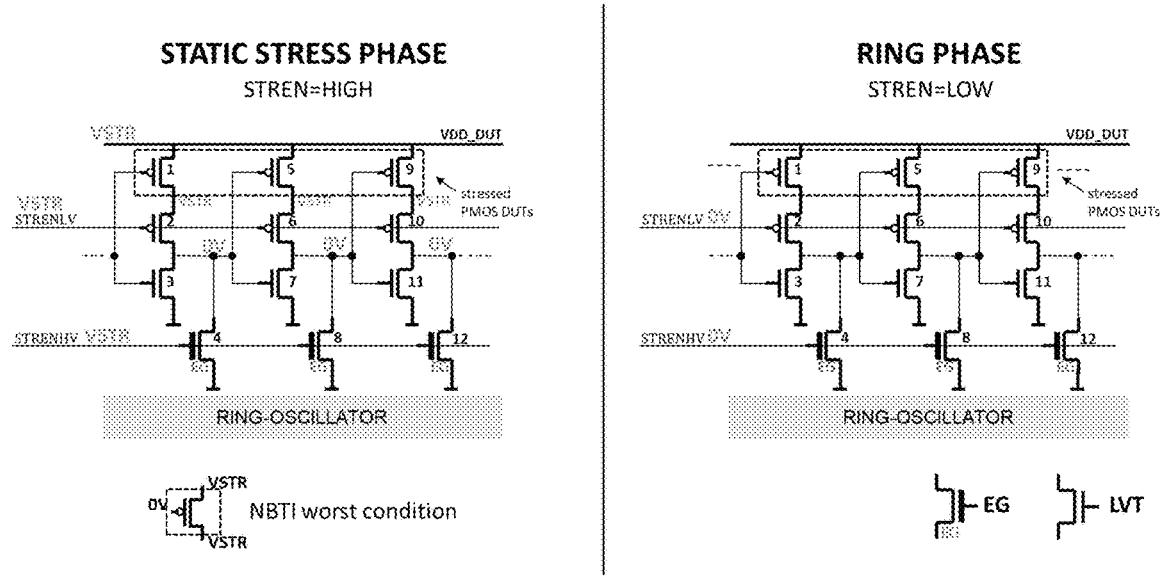
FIG. 8 RO_DUT_P conceptual stress and ring operations
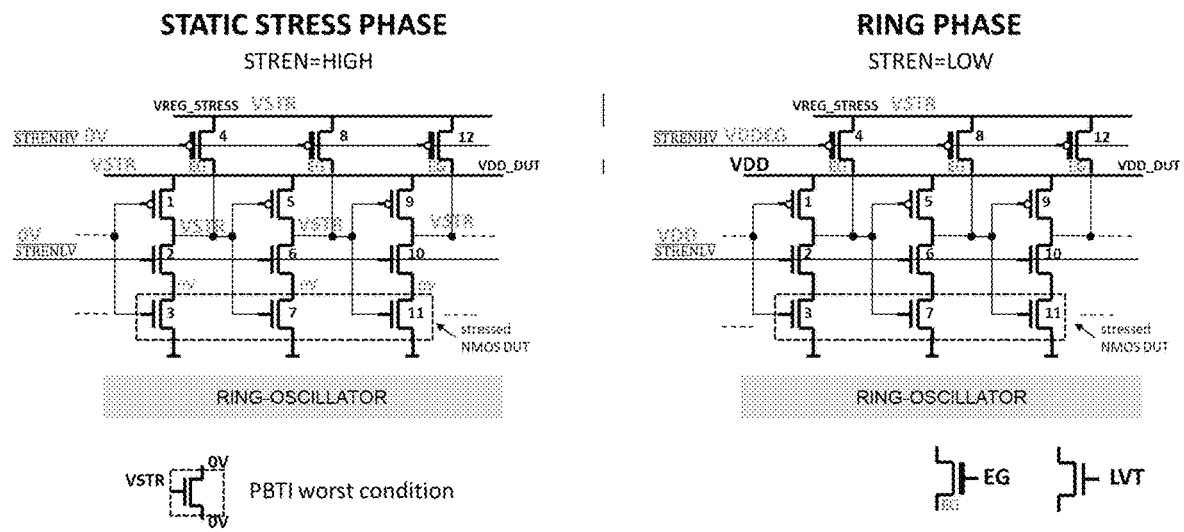
FIG. 9 RO_DUT_N conceptual stress and ring operations

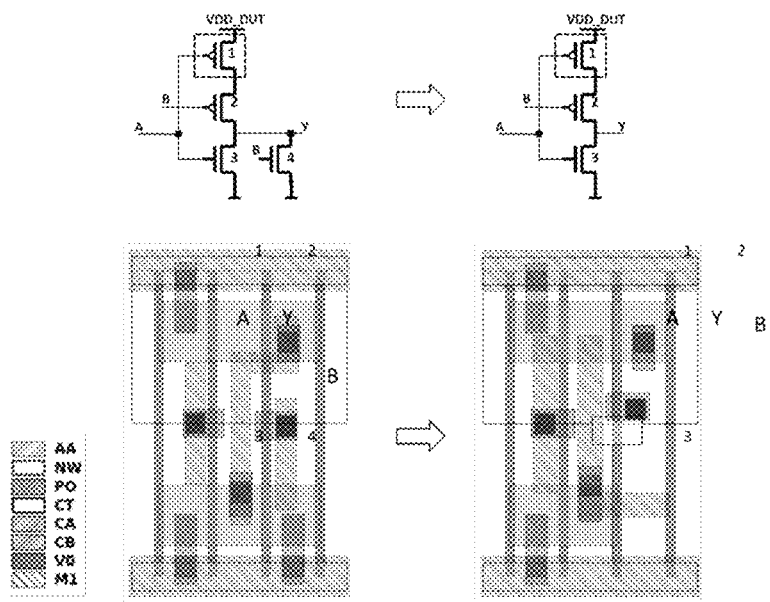
FIG. 10 RO_DUT_P stage design NOR standard cell library
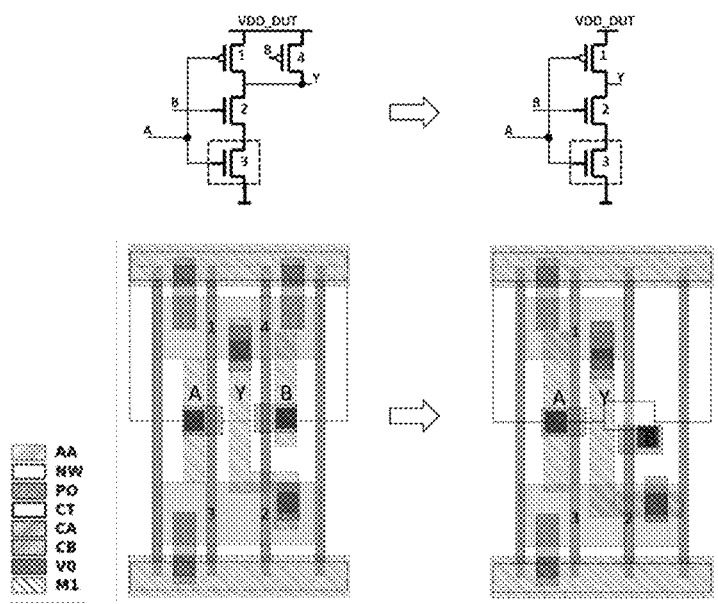
FIG. 11 RO_DUT_N stage design from NAND standard cell library

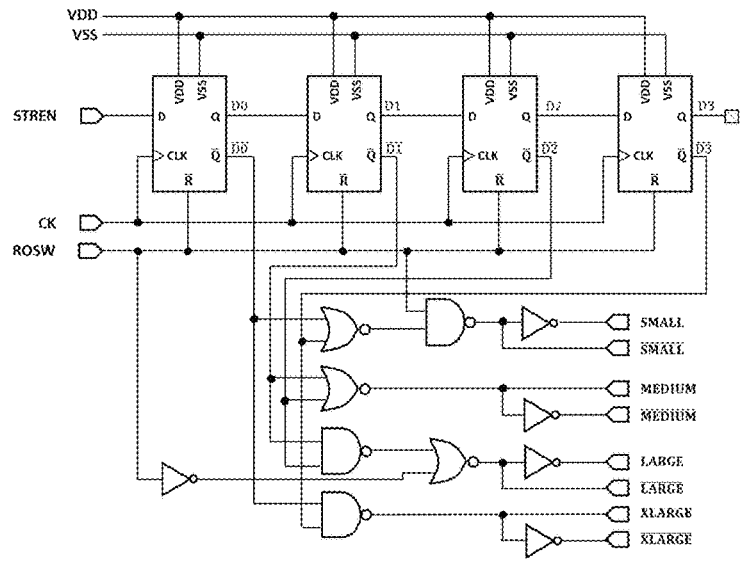
FIG. 12 RO Aging States Logic
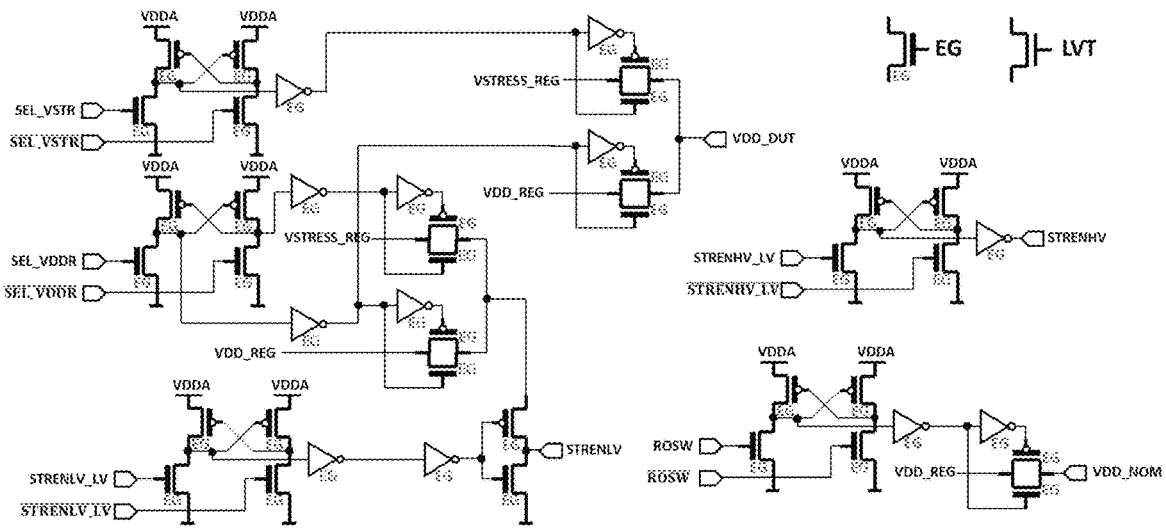
FIG. 13 RO Aging Interface HV switches

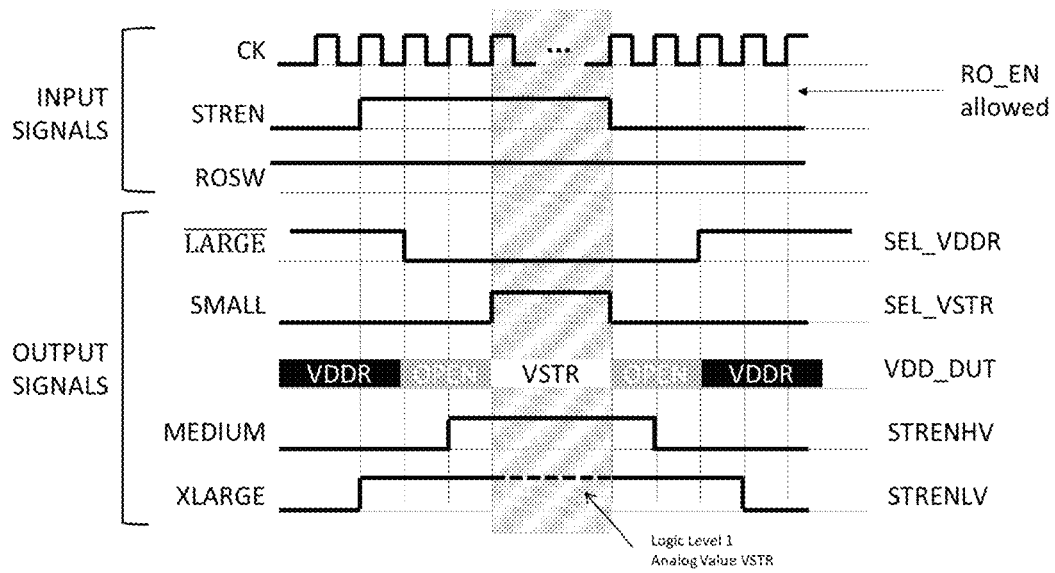
FIG. 14 RO Aging States Logic – P-Type signals
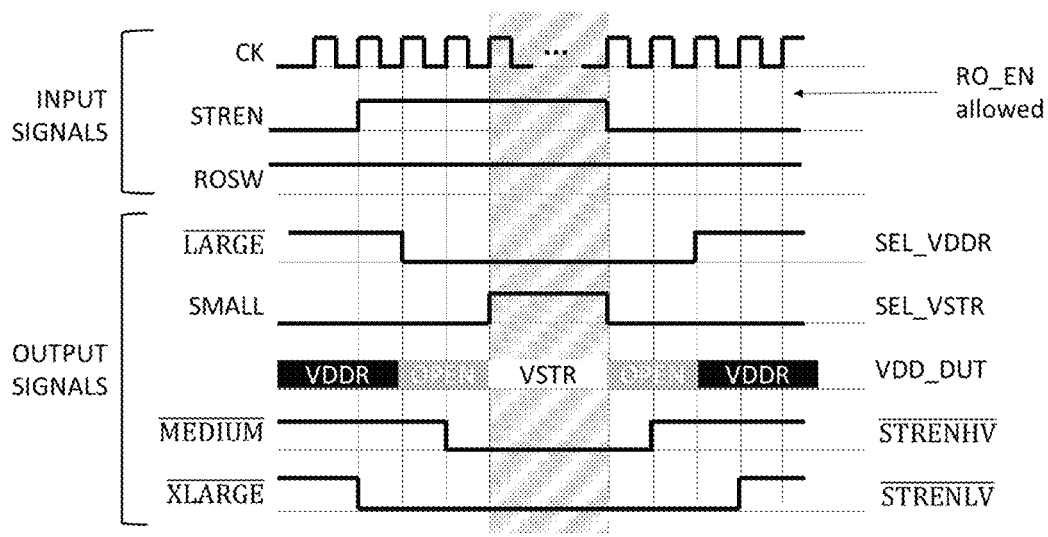
FIG. 15 RO Aging States Logic – N-Type signals

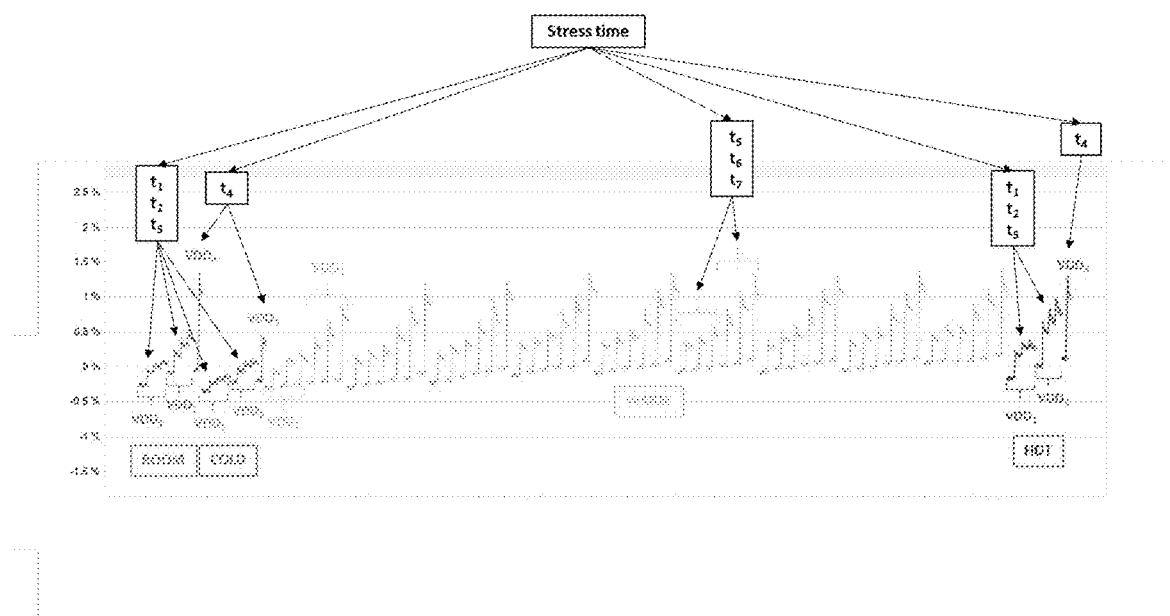
FIG. 16 Typical BTI sensor results for different temperature, product test phase (EWS, BI, FT) and stress voltages

EMBEDDED SYSTEM TO CHARACTERIZE BTI DEGRADATION EFFECTS IN MOSFETs

CROSS-REFERENCE TO RELATED APPLICATION

This application claims priority from U.S. Provisional Patent Application Ser. No. 63/421,161, filed Oct. 31, 2022, for EMBEDDED SYSTEM TO CHARACTERIZE BTI DEGRADATION EFFECTS IN MOSFETS, by the inventors herein, which '161 application is incorporated by reference herein.

FIELD OF THE INVENTION

The present invention relates generally to the characterization and monitoring of MOSFET devices, and more particularly to degradation due to the Bias Temperature Instability (BTI) effect.

BACKGROUND

MOSFET transistors' electrical properties (i.e., threshold voltage and drain current) used in integrated circuits tend to degrade with time due to their activity while the product they are part of is operating. The continuous degradation of such transistors is such that at a certain point in time, the product will exhibit partial or total failure. One of such critical degradation mechanisms is the Bias Temperature Instability (BTI) effect. It is known that when the MOSFET transistor is biased in such a way as to induce the channel (inversion condition), the electric field in the gate dielectric may cause a movement of the charges and ionic species, as well as charge trapping, which may result in a permanent or temporary shift of device parameters, such as Threshold Voltage or/and Transconductance. Once the bias conditions change, the charge can move in an opposite direction, or empty the trap sites in the dielectric or at the interface with the channel. This phenomenon is called relaxation. Most of the relaxation occurs in the very immediate time interval (microseconds range) after the stress condition has changed. The relaxation is a key effect in BTI for accurate characterization, which enables the prediction of residual trapped charge in the insulator.

The described degradation mechanism is a function of temperature, voltage, and time at which the device is biased (stress phase), which trigger the BTI effect. The BTI effect can be accelerated by using either higher temperature and/or voltage compared to the normal device operating conditions.

While the BTI effect has been largely characterized, this has been done by means of either standalone test structures that require proper external equipment to operate or by embedded structures that require the host product to change or stop its standard operations during the stress and measurement phase.

SUMMARY OF THE INVENTION

According to the embodiments herein, a novel system for in-product Bias Temperature Instability (BTI) characterization that allows for characterization of transistor degradation rates is disclosed. It is preferably self-testing and can be embedded in real products without impacting the host functionality. The test data collected during product chip testing (at Electrical Wafer Sort) can be used for identification of abnormal material and for material disposition, or to predict the chip aging rate and premature failure risk due to BTI degradation. The system can also collect the data from the real time device aging in the field, during the host chip operational lifetime.

In accordance with certain embodiments, the system is equipped with local programmable power supply generation and self-test capabilities to allow concurrent operations with the host application. The Devices Under Test (DUTs) consist of standard cell-based Ring Oscillators (ROs) which have the unique capability of decoupling the BTI effects on N-type and P-type MOSFET transistors. New switching circuitry is implemented that provides for minimal delay between the stress and measurement phases, thus giving the system the capability of fully characterizing the BTI relaxation dynamic.

Advantages of the various embodiments include:
Enabling accelerated characterization of BTI degradation rate in MOSFET transistors that can be embedded into general-purpose chips as standard peripheral units, adjustable to fit in the available test time allocated for the peripheral elements;
Monitoring the degradation of the stressed devices through measurements during the stress and the relaxation effects after the stress is removed;
Self-test capability, once initially configured, when embedded into a general-purpose chip (i.e., doesn't require special test equipment in addition to the one used for the general-purpose chip);
Ability to exchange data through standard BUS interface (s), such as JTAG and/or APB;
Ability to adjust the BTI stress conditions by locally modulating power supply over-voltage, without affecting the operations and functionalities of the host product chip in which the system is embedded;
Device Under Test (DUT) design that provides the ability to uniquely separate the BTI degradation rate effect for P-type and N-type MOSFET transistors;
A novel switching network that allows the DUTs to use an alternative dedicated local over-voltage generator, which minimizes the settling delay for extremely short-time BTI dynamic effects characterization, and which is more accurate and less noisy compared to the nominal product power supply;
Prediction of the BTI degradation rate of the host product chip during its operational life based on the BTI embedded system data collected during the sort;
Identification of material with abnormal BTI degradation rate; and/or,
Monitoring for BTI degradation in the field.

Accordingly, generally speaking, and without intending to be limiting, one aspect of the invention relates to embedded circuitry for testing/monitoring transistor degradation due to bias temperature instability (BTI), comprising, for example, at least: a first array of reference devices under test (DUTs), configured as a plurality of independently selectable, reference ring oscillator (RO) chains; a second array of stressable DUTs, configured as a plurality of independently selectable, stressable RO chains; stress generating circuitry, configured to selectively apply an over-voltage stress condition to transistors in the stressable RO chains contained within the second array without affecting operating conditions in other parts of a die/chip/wafter in which said embedded circuitry is contained; frequency counting circuitry for determining oscillation frequencies of ROs in the first and second arrays; control logic circuitry, configured to selectively control application of over-voltage stress conditions to selected, stressable DUTs contained in the second array; and, multiplexing circuitry, responsive to the control logic circuitry, to initiate count(s) of oscillation frequencies for selected stressable RO chains, immediately after termination of over-voltage stress conditions, thereby enabling accurate characterization of BTI relaxation effect(s). In certain embodiments, the multiplexing circuitry and control logic circuitry cooperate to initiate counting the oscillation frequency of the selected stressable RO chain within four clock cycles of the termination of the over-voltage stress condition at the selected stressable RO chain. In certain embodiments, each of the first and second arrays contains sixteen RO chains. In certain embodiments, the multiplexing circuitry is configured to individually and selectively connect each of the thirty-two RO chains to the frequency counting circuitry. In certain embodiments, the second array comprises: a plurality of P-type stressable DUTs, connected to form P-type stressable RO chains; and, a plurality of N-type stressable DUTs, connected to form N-type stressable RO chains. In certain embodiments, the embedded circuitry is configured to support separate characterization of BTI relaxation effects in P-type and N-type transistors. In certain embodiments, the embedded circuitry further includes data out buffer circuitry. In certain embodiments, the data out buffer circuitry is configured to buffer data from the frequency counting circuitry to an industry standard bus interface. In certain embodiments, the industry standard bus interface is a JTAG interface. And in certain embodiments, the industry standard bus interface is an APB interface.

Again, generally speaking, and without intending to be limiting, another aspect of the invention relates to a process for testing/monitoring transistor degradation due to bias temperature instability (BTI) using embedded circuitry by, for example: (i) applying an over-voltage stress condition to a stressable ring oscillator (RO) chain, without applying the over-voltage stress condition to other portions of a system in which said embedded circuitry is contained; (ii) selectively removing the over-voltage stress condition; and (iii) within four clock cycles of the removal of the over-voltage stress condition, initiating counting an oscillation frequency of the stressable RO chain to characterize BTI relaxation for transistors in the stressable RO chain.

BRIEF DESCRIPTION OF THE DRAWINGS

FIG. 1 shows an embedded sensor architecture.
FIG. 2 shows a slave BTI sensor architecture (hard macro).
FIG. 3 shows P-type local control logic.
FIG. 4 shows N-type local control logic.
FIG. 5 shows an RO_DUT_P.
FIG. 6 shows RO_DUT_N.
FIG. 7 shows a TIE HIGH cell.
FIG. 8 shows RO_DUT_P conceptual stress and ring operations.
FIG. 9 shows RO_DUT_N conceptual stress and ring operations.
FIG. 10 shows an RO_DUT_P stage design from a NOR standard cell library.
FIG. 11 shows an RO_DUT_N stage design from a NAND standard cell library.
FIG. 12 shows RO Aging States Logic.
FIG. 13 shows RO Aging Interface HV switches.
FIG. 14 shows RO Aging States Logic—P-Type signals.
FIG. 15 shows RO Aging States Logic—N-Type signals.
FIG. 16 shows typical BTI sensor results for different temperature, product test phase (EWS, BI, FT) and stress voltages.

DESCRIPTION OF THE PREFERRED EMBODIMENTS

The inventive system is organized as in FIG. 1 and includes a Soft Macro which acts as the bridge between a set of sensors and the host product chip standard busses. On the sensors side, the interface is a standard Serial Peripheral Interface (SPI), while on the host side, JTAG and/or Advanced Peripheral Bus (APB) interfaces are implemented. Up to 16 sensors on a system are currently supported. The sensors are implemented as hard macros, such that they can be placed in multiple locations in the host product chip.

The BTI sensor macro architecture is depicted in FIG. 2 and includes 16-pairs of RO DUTs (each pair with identical design parameters), each one built from a specific MOSFET variant (e.g., standard, low, ultra-low, high VT). Only one sensor of each pair (STRESS_ARRAY) will be subject to the stress procedure being driven by a proper set of internally generated power supply values, while the corresponding sensor form the pair (REFERENCE_ARRAY) will be driven by the internally generated nominal product operating voltage. Both arrays are thus powered by a programmable local regulated voltage, which decouples the sensor power supply from the host product chip power supply.

The selection and enabling signals of each DUT are controlled by the SPI MASTER INTERFACE of FIG. 1, which passes the information to the SPI SLAVE INTERFACE of FIG. 1, which, in turn, generates all the control signals of the BTI sensor (FIG. 2). The sensor operations are as follows:

1. Each selected RO DUT of the REFERENCE_ARRAY and of the STRESS_ARRAY (FIG. 2) is powered with a supply voltage equal to the nominal host chip value; afterwards the RO_DUTs are sequentially enabled (oscillation phase).

The output of each RO is fed into a 16-bit counter, clocked at a known reference frequency provided by the host product chip. The count results are passed from a 16-bit register buffer into a Data-bus FIFO (FIG. 2) to be sent later to the system BUS after the entire test program is executed and completed.

2. Each RO DUT of the STRESS_ARRAY is then stressed (stress phase: oscillation is disabled) with a power supply exceeding the nominal core product (VSTR) provided by the REG_STRESS block (FIG. 2) for a programmed time interval (Stress time). At the end of the Stress time, the RO DUT is immediately connected to a power supply provided by the REG_VDD block (FIG. 2), which matches the nominal host chip value, and each DUT is sequentially enabled for standard operations (oscillation phase). The oscillation phase follows the stress phase by only 4 clock cycles of delay, thus enabling the accurate characterization of the BTI relaxation phenomenon. This small latency is enabled by the RO_AGING STATE_LOGIC block (FIG. 12), which controls the switching circuit network, as depicted in FIG. 4 for the P-type and in FIG. 5 for the N-type RO_DUTs. Details of the Low- to High-Voltage circuitry is presented in FIG. 13. The output of each RO_DUT is then fed into a 16-bit counter clocked at a reference frequency provided by the host product chip. The count results are passed from a 16-bit register buffer into a Data-bus FIFO (FIG. 2) to be sent later to the system BUS when the entire test program is executed and completed.

3. Multiple read operations (multiple oscillation phases) can be performed after one stress phase to capture the transient details of the BTI relaxation phenomena (see FIG. 16 for sample results).

The RO_AGING STATE_LOGIC operations are captured in FIGS. 14 and 15 for the P-type and N-type RO DUTs, respectively, where the latency, measured in clock periods, during the switching of the VDD_DUT signal to and from the stress voltage (VSTR) is presented. Once the stress phase is over (STREN signal to logic value '0'), the DUT is switched to the nominal power supply value (VDDR) within two clock cycles and RO_EN signal can be raised after only 4 clock cycles.

The RO_DUTs comprise a ring of 188 identical inverting stages (CORE_STAGES), except for the RO_EN stages (EN_STAGES), which comprise a standard NAND logic gate and two additional NAND stages (one before and one after) to provide protection for the enabling stage against possible shorts in the inverting stages due to the applied high voltage on the transistor gates. Whenever required, the TIE_HIGH library cell in FIG. 7 is used to permanently bias terminals to the nominal power supply value. The total number inverting stages sums up to 191. The RO_DUTs are depicted in FIGS. 5 and 6 for the P-type and N-type DUTs, respectively. While all the CORE_STAGES can be biased through VDD_DUT to the stress voltage, the EN_STAGES are always biased at the nominal host product power supply value. The CORE_STAGES stages are derived from either a NAND or a NOR library standard cell to match the product transistor sizing and environment. A minimal modification of the original standard cell layout is applied to transform the selected logic gate into an equivalent inverter cell with local selection capabilities (stage enabling signal) and to guarantee that only one properly selected device is subject to the applied high voltage bias (which, as a consequence, is the only device subjected to the BTI degradation effect).

FIG. 10 shows the layout and corresponding schematic modification of the NOR standard cell to achieve the above-mentioned transformation for the P-type CORE_STAGE. In order to achieve the result, the active layer of the second NMOS transistor (n.4) has been removed. In this configuration, transistor n.1 is the device that will be stressed, transistor n.2 acts as a stage selection device by using its 'B' signal, and transistor n.3 completes the inverting stage.

Similarly, FIG. 11 presents the dual modifications to be applied to the NAND cell to achieve the dual result in the case of an NMOS only BTI sensitive stage. The P-type transistor n.4 is removed from the stage by stripping the corresponding active layer, N-type transistor n.3 becomes the only BTI sensitive device for this stage, and the N-type transistor n.2 becomes the stage selection device through the 'B' signal, and the P-type transistor n.1 completes the inverting stage.

In order to achieve high-voltage stress biasing, thick oxide devices (EG) are needed to properly drive the gate of the BTI susceptible transistor. FIG. 6 and FIG. 7 shows such connections for the P-type and N-type BTI sensitive transistors, respectively.

One critical aspect of using ring oscillators to monitor transistor BTI degradation is the capability of the CORE_STAGE to trigger the effect for only one transistor type. Our inventive solution achieves this goal, as explained in FIG. 8 and FIG. 9, for the P-type and N-type transistors, respectively.

The stress phase for the P-type CORE_STAGE can be understood by looking at FIG. 8: during this phase, the STRENLV is pulled to VSTR, thus turning the selection transistor n.6 off and forcing zero current into each CORE_STAGE; the STRENHV is pulled to VSTR, thus forcing the gate of the BTI sensitive transistor n.5 to 0 volts; the BTI sensitive transistor source terminal is forced at VSTR, its drain terminal needs to be set at VSTR as well, thus putting this transistor in the maximum BTI degradation condition. It must also be noted that no other transistors are biased into such an operating point and they are not subject to severe BTI degradation. Once the stress phase is concluded, the BTI source terminal is switched to the nominal power supply value, and both the STRENLV and STRENHV signals are pulled down to 0 volts such that the CORE_STAGE behaves like a regular inverting stage, thus enabling the oscillation phase.

The dual circuitry of FIG. 9 illustrates the stress phase for the N-type BTI sensitive device: the complementary STRENLV and STRENHV signals are used to pull down the selection N-type transistor n.6, thus cutting off any current flow in the CORE_STAGE, and to pull-up to VSTR the gate of the BTI sensitive device n.7. Similar to the P-type case, the maximum BTI degradation conditions are applied to the BTI sensitive device n.7.

FIG. 16 shows silicon typical results for a P-type RO_DUT. Several temperature test sessions at different stress times and voltages are reported to explore the BTI effect sensitivity. Measurements taken at $VDD_1$ and $VDD_2$ include 3 consecutive pre-stress measurements, followed by three stress cycles (at the same VDD) and 3 consecutive measurements after each stress cycle, while for the $VDD_3$ and $VDD_4$ cases, three initial consecutive pre-stress measurements are followed by 1 stress cycle and 3 consecutive measurements.

The stress time intervals are the same for the ROOM, COLD and HOT test phases, while they are different (significantly longer) for the WARM one.

What we claim in this application is:

1. Embedded circuitry for testing/monitoring transistor degradation due to bias temperature instability (BTI), said embedded circuitry including at least:
   a first array of reference devices under test (DUTs), configured as a plurality of independently selectable, reference ring oscillator (RO) chains;
   a second array of stressable DUTs, configured as a plurality of independently selectable, stressable RO chains;
   stress generating circuitry, configured to selectively apply an over-voltage stress condition to transistors in the stressable RO chains contained within the second array without affecting operating conditions in other parts of a die/chip/wafter in which said embedded circuitry is contained;
   frequency counting circuitry for determining oscillation frequencies of ROs in the first and second arrays;
   control logic circuitry, configured to selectively control application of over-voltage stress conditions to selected, stressable DUTs contained in the second array; and,
   multiplexing circuitry, responsive to the control logic circuitry, to initiate count(s) of oscillation frequencies for selected stressable RO chains, immediately after termination of over-voltage stress conditions, thereby enabling accurate characterization of BTI relaxation effect(s).

2. Embedded circuitry, as defined in claim 1, wherein the multiplexing circuitry and control logic circuitry cooperate to initiate counting the oscillation frequency of the selected stressable RO chain within four clock cycles of the termination of the over-voltage stress condition at the selected stressable RO chain.

3. Embedded circuitry, as defined in claim 2, wherein each of the first and second arrays contains sixteen RO chains.

4. Embedded circuitry, as defined in claim 3, wherein the multiplexing circuitry is configured to individually and selectively connect each of the thirty-two RO chains to the frequency counting circuitry.

5. Embedded circuitry, as defined in claim 2, wherein the second array comprises:
   a plurality of P-type stressable DUTs, connected to form P-type stressable RO chains; and
   a plurality of N-type stressable DUTs, connected to form N-type stressable RO chains.

6. Embedded circuitry, as defined in claim 5, wherein said embedded circuitry is configured to support separate characterization of BTI relaxation effects in P-type and N-type transistors.

7. Embedded circuitry, as defined in claim 2, further comprising data out buffer circuitry.

8. Embedded circuitry, as defined in claim 7, wherein the data out buffer circuitry is configured to buffer data from the frequency counting circuitry to an industry standard bus interface.

9. Embedded circuitry, as defined in claim 8, wherein the industry standard bus interface is a JTAG interface.

10. Embedded circuitry, as defined in claim 8, wherein the industry standard bus interface is an APB interface.

11. A process for testing/monitoring transistor degradation due to bias temperature instability (BTI) using embedded circuitry, said process comprising at least the following steps:
   (i) applying an over-voltage stress condition to a stressable ring oscillator (RO) chain, without applying the over-voltage stress condition to other portions of a system in which said embedded circuitry is contained;
   (ii) selectively removing the over-voltage stress condition; and
   (iii) within four clock cycles of the removal of the over-voltage stress condition, initiating counting an oscillation frequency of the stressable RO chain to characterize BTI relaxation for transistors in the stressable RO chain.

* * * * *